US012661690B2

(12) United States Patent
  Izuo et al.

(10) Patent No.: US 12,661,690 B2
(45) Date of Patent: Jun. 23, 2026

(54) ULTRASONIC SENSOR

(71) Applicant: SEIKO EPSON CORPORATION, Tokyo (JP)

(72) Inventors: Seiji Izuo, Shiojiri (JP); Eiji Osawa, Matsumoto (JP); Mitsuru Miyasaka, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 911 days.

(21) Appl. No.: 17/973,592

(22) Filed: Oct. 26, 2022

(65) Prior Publication Data

US 2023/0129454 A1     Apr. 27, 2023

(30) Foreign Application Priority Data

Oct. 27, 2021   (JP) ................................. 2021-175683

(51) Int. Cl.
  B06B 1/06        (2006.01)
  G01S 7/521       (2006.01)
  G01S 15/89       (2006.01)
  H10N 30/20       (2023.01)

(52) U.S. Cl.
  CPC ............ B06B 1/0629 (2013.01); G01S 7/521 (2013.01); G01S 15/8925 (2013.01); H10N 30/2047 (2023.02)

(58) Field of Classification Search
  CPC ......... G10K 9/125; G01S 15/89; G01S 15/08; G01S 15/8925; G01S 7/521; H10N 30/2047; B06B 1/0629
  See application file for complete search history.

(56) References Cited

U.S. PATENT DOCUMENTS

2004/0226378 A1    11/2004  Oda et al.
2022/0291513 A1*   9/2022  Senkal .................... G06F 3/013

FOREIGN PATENT DOCUMENTS

JP        2004-343482 A    12/2004
JP        2021-057752 A     4/2021
JP        2021-144987 A     9/2021

* cited by examiner

*Primary Examiner* — J. San Martin
(74) *Attorney, Agent, or Firm* — Harness, Dickey & Pierce, PLC

(57)       ABSTRACT

An ultrasonic sensor is a sensor that transmits an ultrasonic wave to a target object and receives the ultrasonic wave reflected by the target object, the ultrasonic sensor including an ultrasonic array chip on which ultrasonic elements that transmit and receive the ultrasonic wave are arranged in an array shape. Each of the ultrasonic elements includes a vibrating section and a piezoelectric element provided in the vibrating section, vibrates the vibrating section to transmit the ultrasonic wave, and outputs a reception signal of the ultrasonic wave by the vibration of the vibrating section. A resonance frequency of the ultrasonic element is 2000 kHz or less.

4 Claims, 10 Drawing Sheets

ULTRASONIC SENSOR

The present application is based on, and claims priority from JP Application Serial Number 2021-175683, filed Oct. 27, 2021, the disclosure of which is hereby incorporated by reference herein in its entirety.

BACKGROUND

1. Technical Field

The present disclosure relates to an ultrasonic sensor.

2. Related Art

There has been known an ultrasonic sensor that transmits an ultrasonic wave and receives a reflected wave reflected by a target object to measure, for example, the distance to the target object (see, for example, JP-A-2004-343482 (Patent Literature 1)).

In the ultrasonic sensor of the related art described in Patent Literature 1, a piezoelectric vibrator vibrates to generate an ultrasonic wave and the ultrasonic wave reflected by the target object is received by the piezoelectric vibrator. Capacitors are coupled to the piezoelectric vibrator in parallel. The capacitors coupled to the piezoelectric vibrator in parallel can be selected by switch operation. In such an ultrasonic sensor, a combination of the capacitors coupled to the piezoelectric vibrator is changed to control a reverberation time required until a reception signal output when the piezoelectric vibrator receives the reflected wave is attenuated.

However, in the ultrasonic vibrator of a so-called bulk type described in Patent Literature 1 that transmits the ultrasonic wave with vibration of a piezoelectric element itself and, when the piezoelectric element itself receives the ultrasonic wave and vibrates, detects the reception of the ultrasonic wave, it is difficult to reduce an ultrasonic element in size in manufacturing. For example, it is difficult to measure a short distance of 10 mm or less.

That is, when a target object disposed at a short distance is detected using an ultrasonic wave, it is necessary to reduce the reverberation time using an ultrasonic wave having a high frequency. However, in the bulk-type ultrasonic vibrator, a reduction in size is difficult as explained above and there is a limit in increasing the frequency of the ultrasonic wave.

When the target object disposed at the short distance is measured by the ultrasonic wave, it is desired to detect a shape such as unevenness and an inclination state in a narrow range of the target object. However, in the bulk-type ultrasonic vibrator described in Patent Literature 1, since a reduction in size is difficult, there is also a limit in reducing a spot diameter of the ultrasonic wave.

SUMMARY

An ultrasonic sensor according to a first aspect of the present disclosure is an ultrasonic sensor that transmits an ultrasonic wave to a target object and receives the ultrasonic wave reflected by the target object, the ultrasonic sensor including an ultrasonic array chip on which ultrasonic elements that transmit and receive the ultrasonic wave are arranged in an array shape. Each of the ultrasonic elements includes a vibrating section and a piezoelectric element provided in the vibrating section, vibrates the vibrating section with voltage application to the piezoelectric element to transmit the ultrasonic wave, and detects reception of the ultrasonic wave with a signal output from the piezoelectric element by the vibration of the vibrating section. A resonance frequency of the ultrasonic element is 2000 kHz or less.

In the ultrasonic sensor according to this aspect, when viewed from a transmission direction of the ultrasonic wave, the ultrasonic array chip may have a rectangular shape, and length of one side of the ultrasonic array chip may be 5 mm or less.

In the ultrasonic sensor according to this aspect, the resonance frequency of the ultrasonic element may be less than 1000 kHz, and the ultrasonic element may be configured to set a reverberation time to 60 μs or less, the reverberation time being a time until vibration amplitude of the vibrating section caused by transmitting the ultrasonic wave from the ultrasonic element decreases to 10% or less of the vibration amplitude of the vibrating section immediately after the transmission of the ultrasonic wave.

In the ultrasonic sensor according to this aspect, the resonance frequency of the ultrasonic element may be 1000 kHz or more and less than 1500 kHz, and the ultrasonic element may be configured to set a reverberation time to 50 μs or less, the reverberation time being a time until vibration amplitude of the vibrating section caused by transmitting the ultrasonic wave from the ultrasonic element decreases to 10% or less of the vibration amplitude of the vibrating section immediately after the transmission of the ultrasonic wave.

In the ultrasonic sensor according to this aspect, the resonance frequency of the ultrasonic element may be 1500 kHz or more and 2000 kHz or less, and the ultrasonic element may be configured to set a reverberation time to 25 μs or less, the reverberation time being a time until vibration amplitude of the vibrating section caused by transmitting the ultrasonic wave from the ultrasonic element decreases to 10% or less of the vibration amplitude of the vibrating section immediately after the transmission of the ultrasonic wave.

BRIEF DESCRIPTION OF THE DRAWINGS

FIG. 1 is a schematic diagram showing a schematic configuration of an ultrasonic sensor in an embodiment of the present disclosure.

FIG. 7 is a diagram showing a change in vibration of vibrating sections after an ultrasonic wave is transmitted from the ultrasonic sensor in the embodiment.

DESCRIPTION OF EXEMPLARY EMBODIMENTS

Figure 2:
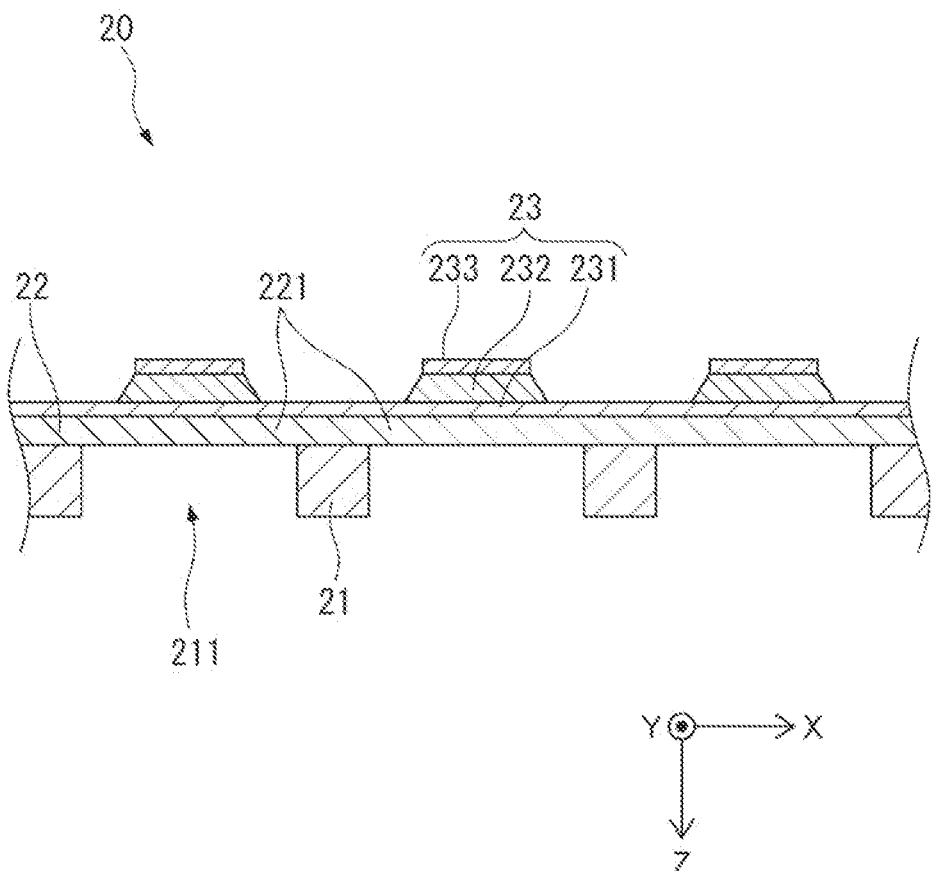
FIG. 2 is a sectional view showing a schematic configuration of an ultrasonic array chip in the embodiment.

An ultrasonic sensor in an embodiment is explained below.

Figure 1:
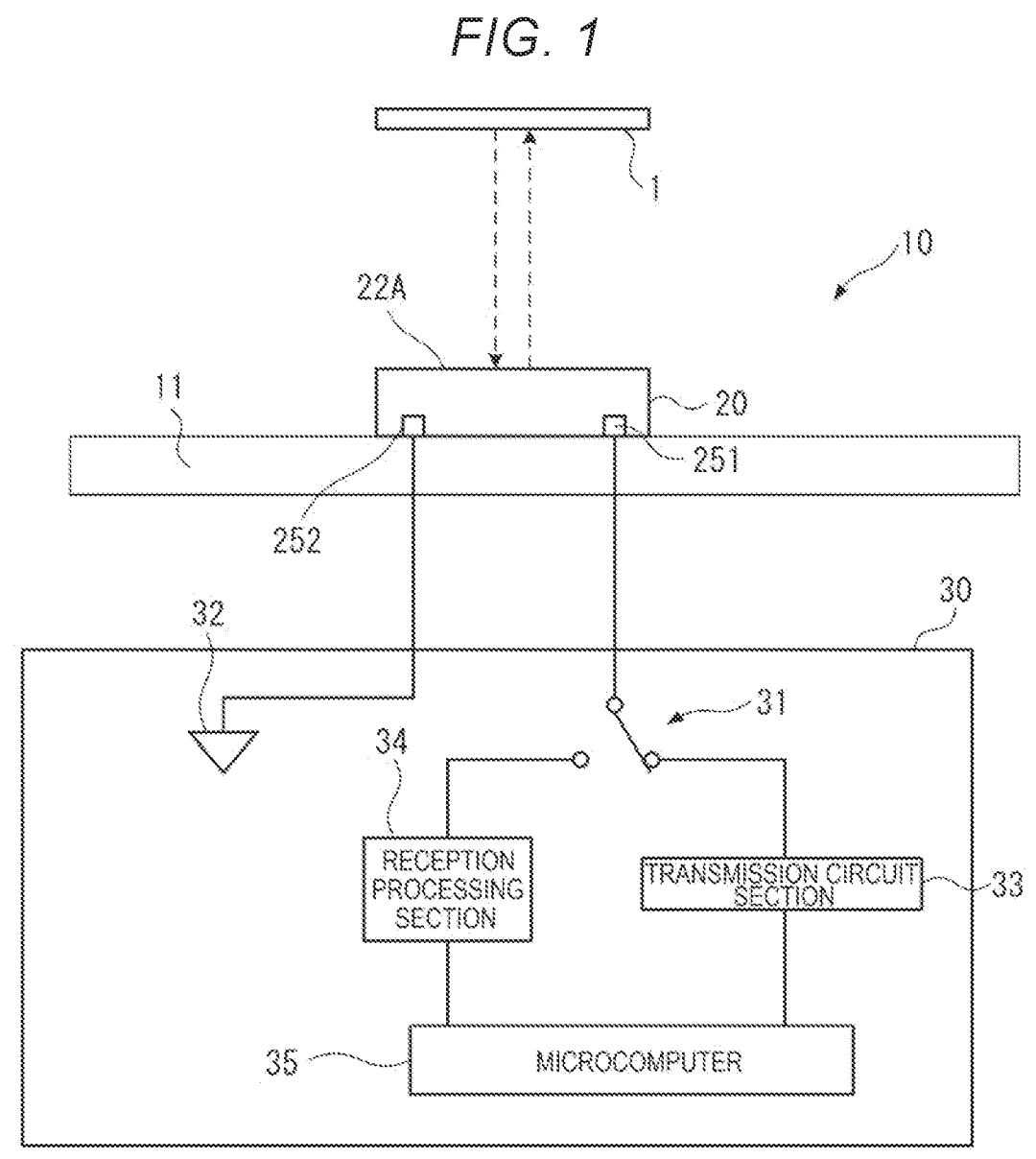

FIG. 1 is a schematic diagram showing a schematic configuration of an ultrasonic sensor 10 in this embodiment.

The ultrasonic sensor 10 includes an ultrasonic array chip 20 disposed on a base material 11 or the like and a control circuit 30 that controls the ultrasonic array chip 20. The ultrasonic sensor 10 carries out, according to control of the control circuit 30, ultrasonic wave transmission and reception processing for transmitting an ultrasonic wave from the ultrasonic array chip 20 toward a target object 1 and receiving, in the ultrasonic array chip 20, the ultrasonic wave reflected by the target object 1. The control circuit 30 calculates a distance from the ultrasonic array chip 20 to the target object 1 based on a time from transmission timing of the ultrasonic wave in the ultrasonic wave transmission and reception processing by the ultrasonic array chip 20 until reception timing of the ultrasonic wave reflected by the target object 1.

In particular, a disposition space for the ultrasonic sensor 10 in this embodiment is small. The ultrasonic sensor 10 is advantageous as a measurement device for short distance, the distance of which to the target object 1 is, for example, 10 mm or less. Such an ultrasonic sensor 10 can be applied to, for example, a printer and an image scanner and can be suitably used to measure the distance to a paper surface set as the target object 1 and detect an unevenness state of the paper surface and a conveyance state of the paper surface. It is also possible to, for example, by attaching the ultrasonic sensor 10 to a robot arm or the like, use the ultrasonic sensor 10 to accurately detect the distance between the target object 1 and the robot arm and measure damage due to collision of the robot arm and the target object 1.

When the ultrasonic sensor 10 is applied to the printer or the image scanner, it is preferable to simultaneously detect, for example, inclination of the paper surface and unevenness such as creases.

In the case in which the ultrasonic sensor 10 is mounted on the robot arm or the like, when the robot arm is brought close to the target object 1, damage and flaws of the target object 1 sometimes occur because of unintended contact of the robot arm and the target object 1 if the target object 1 has a protrusion or the like.

Therefore, the ultrasonic sensor 10 preferably not only simply measures the distance to the target object 1 but also properly determines a surface shape of the target object 1. Accordingly, the ultrasonic sensor 10 in this embodiment performs measurement for a narrow range of the target object 1 to detect unevenness and the like of the target object 1.

Details of components of such an ultrasonic sensor 10 are explained below.

Configuration of the Ultrasonic Array Chip 20

FIG. 2 is a sectional view showing a schematic configuration of the ultrasonic array chip 20.

The ultrasonic array chip 20 transmits an ultrasonic wave to the target object 1 and outputs a reception signal according to reception of the ultrasonic wave reflected by the target object 1.

As shown in FIG. 2, the ultrasonic array chip 20 includes an element substrate 21, a vibration plate 22, and piezoelectric elements 23. Although not shown in FIG. 2, the ultrasonic array chip 20 also includes a fixed substrate to which the element substrate 21 is fixed. In the following explanation, a transmission and reception direction of an ultrasonic wave from the ultrasonic array chip 20 toward the target object 1 is represented as a Z direction.

The element substrate 21 is a substrate that supports the vibration plate 22 and is configured by a semiconductor substrate of Si or the like. A plurality of opening sections 211 piercing through the element substrate 21 in the Z direction are provided in the element substrate 21.

The vibration plate 22 is configured by, for example, a laminated body of $SiO_2$ or $ZrO_2$ and provided on a −Z side of the element substrate 21. The vibration plate 22 is supported by the element substrate 21 configuring the opening sections 211 and closes the −Z side of the opening sections 211. Portions of the vibration plate 22 overlapping the opening sections 211 when viewed from the Z direction configure vibrating sections 221 that transmit and receive ultrasonic waves with vibration in the vibration plate 22. A surface on a +Z side of the vibration plate 22, which is a surface on the opposite side of the element substrate 21 and is configured by a plurality of vibrating sections 221 arranged in an array shape, configures an ultrasonic wave transmission and reception surface 22A (FIG. 1).

The piezoelectric elements 23 are provided on the vibration plate 22 and in positions overlapping the vibrating sections 221 when viewed from the Z direction. As shown in FIG. 2, each of the piezoelectric elements 23 is configured by stacking a lower electrode 231, a piezoelectric film 232, and an upper electrode 233 in order on the vibration plate 22.

In such an ultrasonic array chip 20, one ultrasonic transducer 24 (ultrasonic element) is configured by one vibrating section 221 and the piezoelectric element 23 disposed on the vibrating section 221.

In the ultrasonic array chip 20, when a voltage is applied between the lower electrode 231 and the upper electrode 233, the piezoelectric film 232 expands and contracts and the vibrating section 221 vibrates at an oscillation frequency corresponding to, for example, an opening width of the opening section 211. Consequently, an ultrasonic wave is transmitted from the vibrating section 221 toward the +Z side.

In the ultrasonic array chip 20, when the ultrasonic wave reflected by the target object 1 is input to the vibrating section 221, the vibrating section 221 vibrates at amplitude corresponding to a sound pressure of the input ultrasonic wave and a potential difference occurs between the lower electrode 231 side and the upper electrode 233 side of the piezoelectric film 232. Accordingly, a reception signal corresponding to the potential difference is output from the piezoelectric elements 23.

Figure 3:
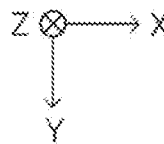
FIG. 3 is a diagram showing a coupling example of ultrasonic transducers in the ultrasonic array chip in the embodiment.

FIG. 3 is a diagram showing a coupling example of ultrasonic transducers 24 in the ultrasonic array chip 20.

In this embodiment, a plurality of ultrasonic transducers 24 are arranged in an n×m matrix shape. Lower electrodes 231 of a plurality of ultrasonic array chips 20 are wire-bonded to one another by a first bypass wire 231A and coupled to first terminals 251 provided in parts of the element substrate 21. Similarly, upper electrodes 233 of the ultrasonic array chips 20 are wire-bonded to one another by a second bypass wire 233A and coupled to second terminals 252 provided in parts of the element substrate 21. The first terminals 251 and the second terminals 252 are respectively coupled to the control circuit 30. In such a configuration, all of the ultrasonic transducers 24 can be simultaneously driven by applying a voltage between the first terminals 251 and the second terminals 252.

The example shown in FIG. 3 is a configuration example in which the lower electrodes 231 of all of the ultrasonic transducers 24 are wire-bonded and coupled to the first terminals 251. However, a predetermined number of ultrasonic transducers 24 may be configured as one channel. The first terminals 251 may be provided for channels. In this case, as in FIG. 3, all of the ultrasonic transducers 24 can be simultaneously driven by simultaneously inputting a driving signal to between all of the first terminals 251 and all of the second terminals 252. It is also possible to individually drive the first terminals 251. In this case, adjustment of a transmission sound pressure can also be performed by controlling the number of channels to be driven. A transmission direction of an ultrasonic wave can be controlled by performing delay control for driving timings of the channels. A plurality of channels may be used by being divided into channels for transmission for transmitting the ultrasonic wave and channels for reception for receiving the ultrasonic wave.

In this embodiment, the ultrasonic array chip 20 has a rectangular shape in a plan view from the Z direction. Specifically, in the ultrasonic array chip 20, an ultrasonic wave transmission and reception region in which the plurality of ultrasonic transducers 24 are arranged, that is, a region configuring the ultrasonic wave transmission and reception surface 22A on which transmission and reception of the ultrasonic wave is performed is formed in a rectangular shape. The length of the long side (an array opening width) of the transmission and reception region having the rectangular shape is set to 5 mm or less. That is, in this embodiment, the length of one side of the ultrasonic array chip 20 being 5 mm or less indicates that the long side (the array opening width) in the rectangular transmission and reception region where the plurality of ultrasonic transducers 24 are arranged is 5 mm or less.

In the ultrasonic array chip 20, a vibration suppression layer having a predetermined Young's modulus may be disposed on the vibration plate 22. For example, a resin material can be used as the vibration suppression layer. The vibration of the vibrating sections 221 can be further suppressed by the vibration suppression layer and a reverberation time can be reduced. The reverberation time in this embodiment indicates a time until, after an ultrasonic wave is transmitted from the ultrasonic transducers 24, the vibration amplitude of the vibrating sections 221 generated at a transmission time of the ultrasonic wave is attenuated to 10% or less.

Frequency and Spot Diameter of Ultrasonic Beam

Subsequently, a frequency of an ultrasonic wave transmitted from the ultrasonic array chip 20 and a spot diameter of an ultrasonic beam formed by the ultrasonic wave are explained.

As explained above, a main object of the ultrasonic sensor 10 in this embodiment is to properly measure the distance between the ultrasonic array chip 20 and the target object 1 located at a short distance from the ultrasonic wave transmission and reception surface 22A of the ultrasonic array chip 20 and appropriately detect a state of unevenness and the like of the target object 1 located at the short distance from the ultrasonic wave transmission and reception surface 22A of the ultrasonic array chip 20.

In this case, the ultrasonic array chip 20 is requested to transmit an ultrasonic beam having a small spot diameter from the ultrasonic wave transmission and reception surface 22A to a target distance range.

In the ultrasonic sensor 10 in this embodiment, the array opening width of the ultrasonic array chip 20 is set to 5 mm or less in the plan view from the Z direction. A resonance frequency of the ultrasonic transducers 24 is 2000 kHz or less.

In such an ultrasonic sensor 10, an ultrasonic beam having a spot diameter of 10 mm or less can be transmitted to a short distance of 50 mm or less from the ultrasonic wave transmission and reception surface 22A. Note that the spot diameter is a maximum diameter of an ultrasonic wave on a plane orthogonal to the transmission direction of the ultrasonic wave (the Z direction).

Figure 4:
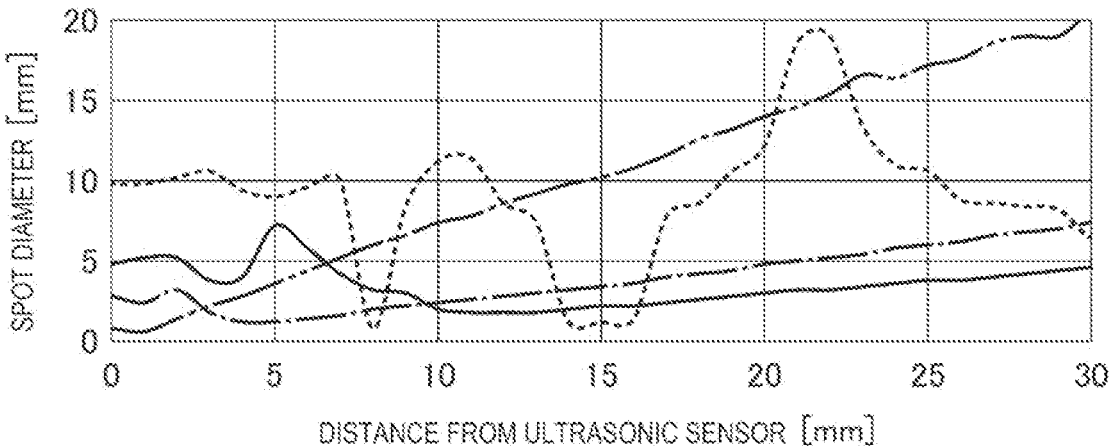
FIG. 4 is a diagram showing a relation between a distance from the ultrasonic array chip and a spot diameter of an ultrasonic beam in the case in which a resonance frequency of the ultrasonic transducers is set to 600 kHz.
Figure 5:
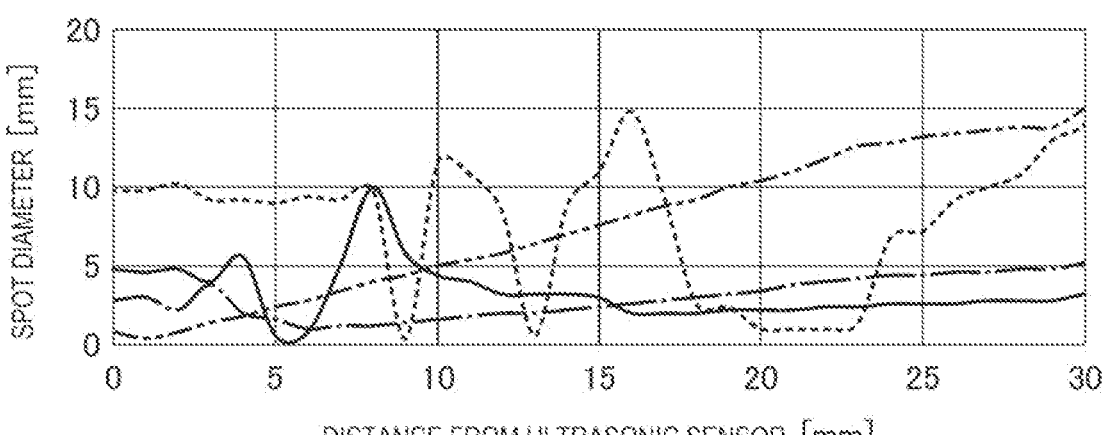
FIG. 5 is a diagram showing a relation between a distance from the ultrasonic array chip and a spot diameter of an ultrasonic beam in the case in which the resonance frequency of the ultrasonic transducers is set to 900 kHz.
Figure 6:
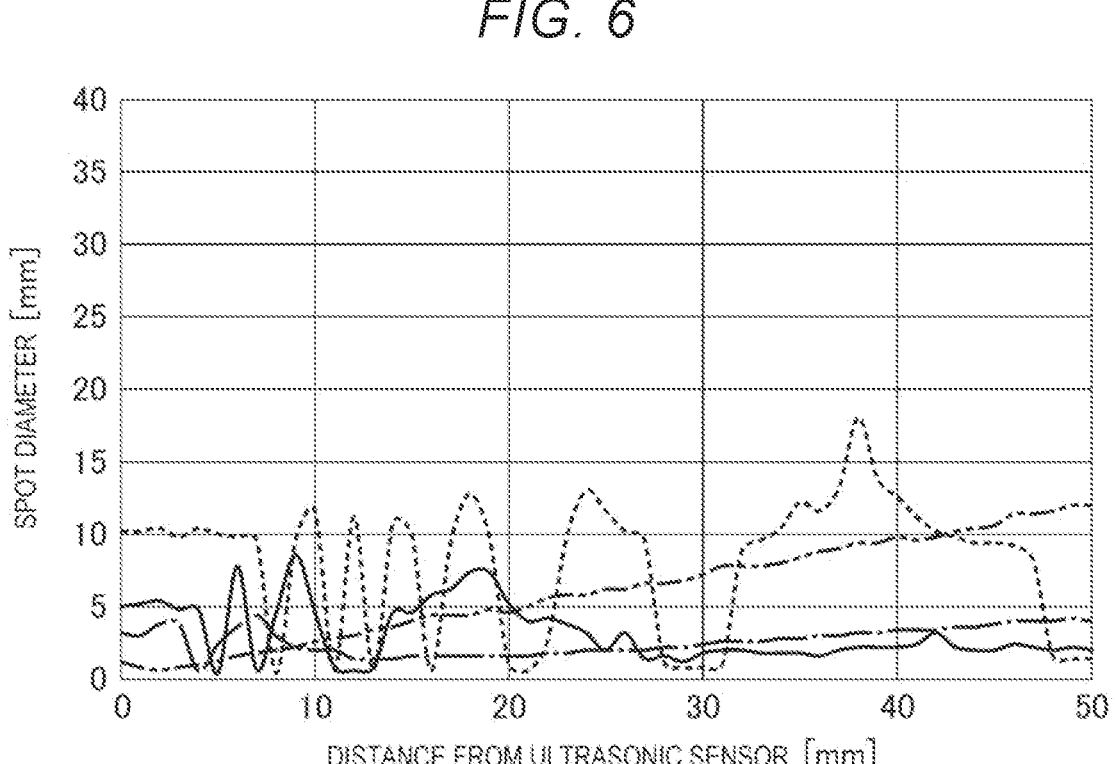
FIG. 6 is a diagram showing a relation between a distance from the ultrasonic array chip and a spot diameter of an ultrasonic beam in the case in which the resonance frequency of the ultrasonic transducers is set to 1000 kHz, 2000 kHz, and 3000 kHz.

FIG. 4 is a diagram showing a relation between a distance from the ultrasonic array chip 20 and a spot diameter of an ultrasonic beam. FIG. 4 shows a spot diameter of an ultrasonic beam about each of cases in which a resonance frequency of the ultrasonic transducers 24 is set to 600 kHz and the array opening width is set to 10 mm, 5 mm, 3 mm, and 1 mm. FIG. 5 shows a spot diameter of an ultrasonic beam about each of cases in which the resonance frequency of the ultrasonic transducers 24 is set to 900 kHz and the array opening width is set to 10 mm, 5 mm, 3 mm, and 1 mm. FIG. 6 shows a spot diameter of an ultrasonic beam about each of cases in which the resonance frequency of the ultrasonic transducers 24 is set to 2000 kHz and the array opening width is set to 10 mm, 5 mm, 3 mm, and 1 mm. In FIGS. 4 to 6, a solid line indicates data in the case of 5 mm, an alternate long and short dash line indicates data in the case of 3 mm, an alternate long and two short dashes line indicates data in the case of 1 mm, and a broken line indicates data in the case of 10 mm.

As shown in FIGS. 4 to 6, when the resonance frequency of the ultrasonic transducers 24 is 2000 kHz or less, the spot diameter can be set to 10 mm or less within a distance range of 10 mm or less from the ultrasonic wave transmission and reception surface 22A if the array opening width is 5 mm or less. In particular, when the resonance frequency exceeds 1 MHz, an ultrasonic beam having a spot diameter of 10 mm or less can be transmitted to a short distance range of 50 mm or less.

On the other hand, when the array opening width exceeds 5 mm, the spot diameter sometimes exceeds 10 mm even in a range of 10 mm or less from the ultrasonic sensor 10. For example, as shown in FIGS. 4 and 5, when the array opening width is set to 10 mm, the spot diameter exceeds 10 mm in a position of approximately 10 mm from the ultrasonic sensor 10.

As the resonance frequency of the ultrasonic transducers 24 is higher, attenuation of an ultrasonic wave is larger. In particular, when the ultrasonic wave is transmitted from the ultrasonic transducers 24 into the air, an attenuation ratio is larger and it is difficult to detect the ultrasonic wave reflected by the target object 1. Accordingly, a frequency of an ultrasonic wave in use, that is, the resonance frequency of the ultrasonic transducers 24 is preferably set to 2000 kHz or less.

In FIGS. 4 to 6, graphs are shown in which the spot diameter is 5 mm or less depending on a frequency band even when the array opening width is more than 5 mm and 10 mm or less. However, when the array opening width exceeds 5 mm, the influence of a side lobe increases and the spot diameter of 10 mm or less sometimes cannot be achieved. In contrast, by setting the array opening width to 5 mm or less, it is possible to achieve the spot diameter of 10 mm or less shown in FIGS. 4 to 6 with respect to the short distance range while suppressing the influence of the side lobe.

When the distance to a target object located at a short distance from the ultrasonic array chip 20 is measured, a so-called ToF (Time of Flight) method for transmitting an ultrasonic wave from the ultrasonic array chip 20, receiving the ultrasonic wave reflected by the target object, and measuring a time from transmission timing of the ultrasonic wave to reception timing of the reflected ultrasonic wave is used.

In order to properly detect the reception timing of the reflected ultrasonic wave with the ToF method, it is necessary to prevent vibration of the vibrating sections 221 due to the reception of the reflected ultrasonic wave from being buried in reverberation vibration of the vibrating sections 221 that occurs at the transmission time of the ultrasonic wave. That is, the vibration amplitude of the vibrating sections 221 at the ultrasonic wave transmission time needs to be attenuated to 10% or less at the reception timing of the reflected ultrasonic wave.

A reverberation time from the ultrasonic wave transmission time to timing when the vibration amplitude of the vibrating sections 221 decreases to 10% or less changes mainly according to the frequency of the ultrasonic wave transmitted from the ultrasonic transducers 24, that is, the resonance frequency of the ultrasonic transducers 24.

Figure 7:
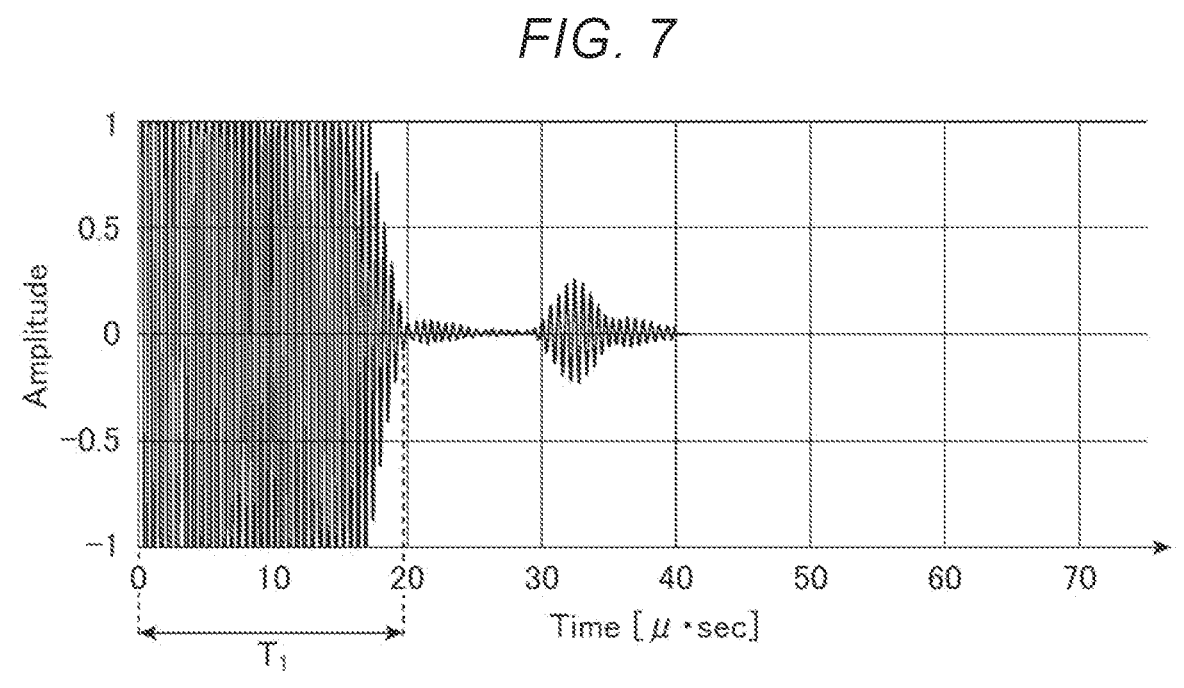
Figure 8:
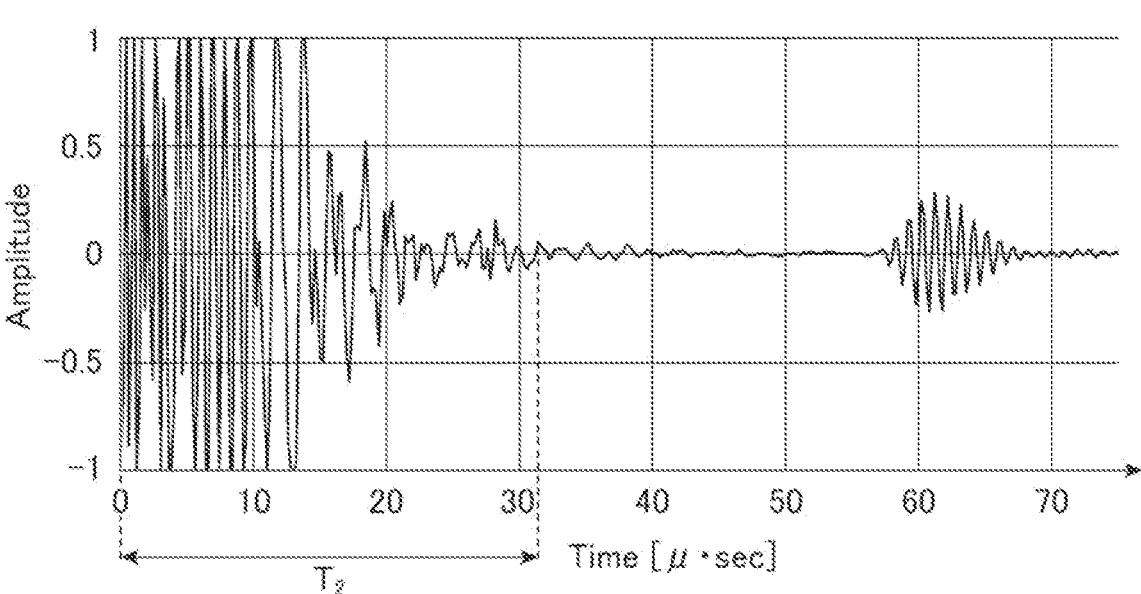
FIG. 8 is a diagram showing a change in vibration of a bulk-type ultrasonic vibrator after an ultrasonic wave is transmitted from the bulk-type ultrasonic vibrator.

FIG. 7 is a diagram showing a change in vibration of the vibrating sections 221 after an ultrasonic wave is transmitted from the ultrasonic sensor 10 in this embodiment. FIG. 8 is a diagram showing a change in vibration of a bulk-type ultrasonic vibrator after an ultrasonic wave is transmitted from the ultrasonic vibrator. FIG. 7 shows a vibration change in the case in which the frequency of the ultrasonic wave is set to 1.7 MHz. FIG. 8 shows a vibration change in the case in which the frequency of the ultrasonic wave is set to 1.5 MHz.

As shown in FIG. 7, in the ultrasonic sensor 10 in this embodiment, a reverberation time $T_1$ is approximately 20 µs. On the other hand, as shown in FIG. 8, in the bulk-type ultrasonic vibrator, a reverberation time 12 is approximately 30 µs.

As shown in FIGS. 7 and 8, in the bulk-type ultrasonic vibrator, the reverberation time tends to be longer compared with a thin film-type ultrasonic element that vibrates the vibrating sections 221 with the piezoelectric elements 23 as in this embodiment.

Figure 9:
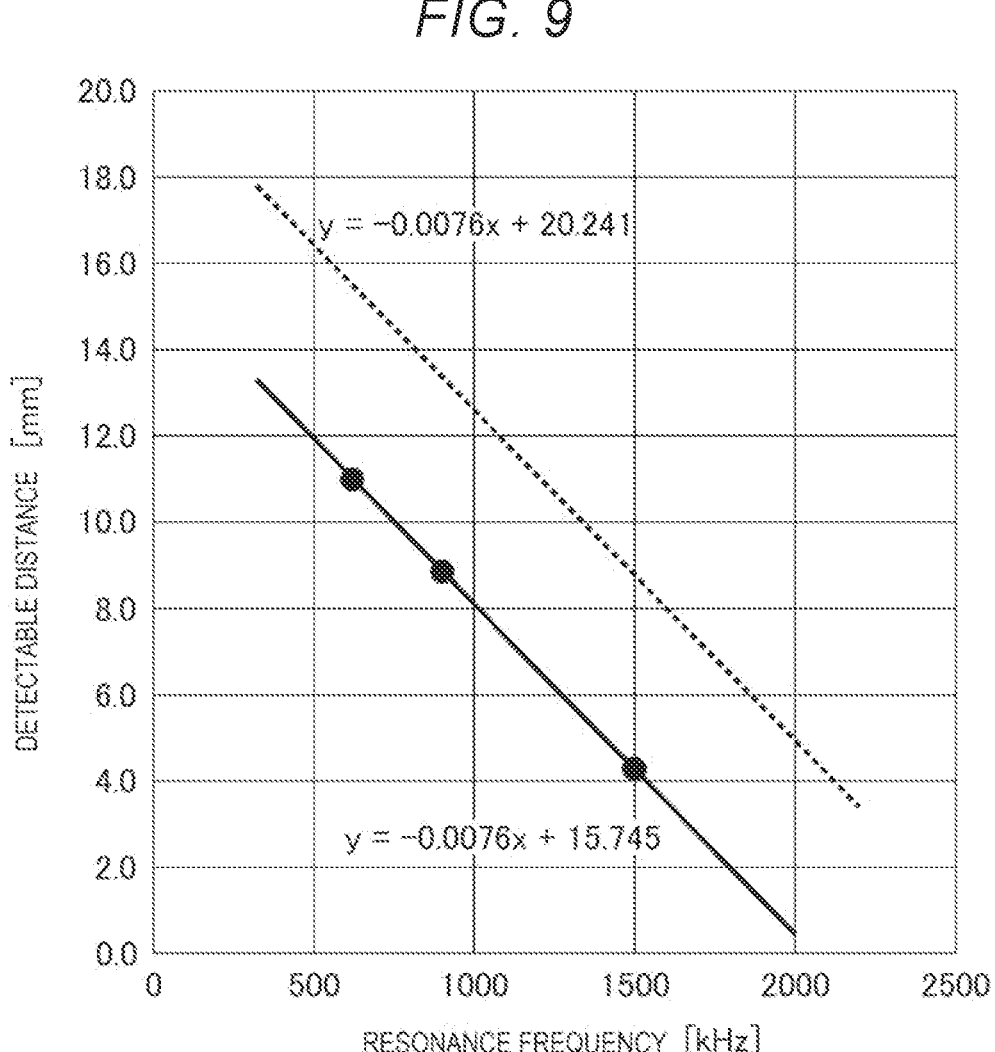
FIG. 9 is a diagram showing a relation between a resonance frequency and a measurable distance in the ultrasonic sensor in the embodiment and the bulk-type ultrasonic vibrator of related art.

FIG. 9 is a diagram showing a relation between a resonance frequency and a measurable distance in the ultrasonic sensor 10 in this embodiment and the bulk-type ultrasonic vibrator of the related art. In FIG. 9, a solid line indicates the relation in the ultrasonic sensor 10 in this embodiment and a broken line indicates the relation in the bulk-type ultrasonic vibrator of the related art.

In general, the bulk-type ultrasonic vibrator of the related art is an element that vibrates a piezoelectric body itself with voltage application to transmit an ultrasonic wave and, when the piezoelectric body itself vibrates because the piezoelectric body receives the ultrasonic wave reflected by the target object, detects the reception of the ultrasonic wave. In such a bulk-type ultrasonic vibrator, the piezoelectric body such as a piezoelectric element needs to be cut in a desired size.

Therefore, it is extremely difficult to form the piezoelectric body in a very small size in manufacturing and manufacturing cost increases.

For example, in FIG. 8, an example of the bulk-type ultrasonic vibrator in which the reverberation time $T_2$ is approximately 30 µs is shown. However, actually, the reverberation time is longer because of, for example, variation of the ultrasonic vibrator. It is difficult to form the bulk-type ultrasonic vibrator in which the reverberation time is 30 µs or less.

The bulk-type ultrasonic vibrator is usually formed by cutting the piezoelectric body. However, when the piezoelectric body is cut by a method such as laser cut that requires less manufacturing cost, only a frequency of 1000 kHz or less among frequencies shown in FIG. 9 can be realized. In such a case, the reverberation time is long and a distance detectable by the bulk-type ultrasonic vibrator exceeds 10 mm.

The bulk-type ultrasonic vibrator is formed in a block shape and the thickness dimension of the bulk-type ultrasonic vibrator is large. Therefore, a disposition space for the bulk-type ultrasonic vibrator is limited.

On the other hand, in the ultrasonic sensor 10 in this embodiment, the thin film-like vibrating sections 221 can be formed on the element substrate 21 of Si or the like by micromachining such as etching. The thin film-like piezoelectric elements 23 can be easily formed in a desired pattern by the etching. In such a configuration, by controlling the opening width of the opening sections 211, the thickness of the vibration sections 221, and the like, the resonance frequency of the ultrasonic transducers 24 can be set to any value of 500 kHz to 2000 kHz. In such an ultrasonic sensor 10, as shown in FIG. 7, the reverberation time can be greatly reduced compared with the bulk-type ultrasonic vibrator. Consequently, as shown in FIG. 9, the target object 1 disposed at a distance of 10 mm or less from the ultrasonic sensor 10 can be properly detected at 500 kHz to 2000 kHz.

As shown in FIGS. 4 to 6 and 9, in this embodiment, the ultrasonic transducers 24 are configured to set the reverberation time to 60 µs or less when the resonance frequency (the frequency of the ultrasonic wave to be transmitted) of the ultrasonic transducers 24 is 600 kHz or more and less than 1000 kHz. Consequently, an ultrasonic beam having a spot diameter of 10 mm or less can be transmitted to the target object 1 at a distance of approximately 10 mm from the ultrasonic sensor 10.

The ultrasonic transducers 24 are configured to set the reverberation time to 50 µs or less when the resonance frequency of the ultrasonic transducers 24 are set to 1000 kHz or more and less than 1500 kHz. Consequently, an ultrasonic beam having a spot diameter of 10 mm or less can be transmitted to the target object 1 at a distance of 5 mm to 10 mm from the ultrasonic sensor 10.

Further, the ultrasonic transducers 24 are configured to set the reverberation time to 25 µs or less when the resonance frequency of the ultrasonic transducers 24 is set to 1500 kHz or more and 2000 kHz or less. Consequently, an ultrasonic beam having a spot diameter of 10 mm or less can be transmitted to the target object 1 at a distance of 5 mm or less from the ultrasonic sensor 10.

In the ultrasonic sensor 10 in this embodiment, the thin film-like piezoelectric elements 23 are disposed in the thin film-like vibrating sections 221. The ultrasonic sensor 10 can be formed extremely thin compared with the bulk-type ultrasonic vibrator. Therefore, flexibility of a disposition space increases. The ultrasonic sensor 10 can be disposed in, for example, a narrow space having a gap dimension of approximately 5 mm.

Configuration of the Control Circuit 30

Referring back to FIG. 1, the control circuit 30 is explained. As explained above, the control circuit 30 is coupled to the first terminal 251 and the second terminal 252 of the ultrasonic array chip 20.

The control circuit 30 includes, as shown in FIG. 1, a switching circuit 31, a signal ground 32, a transmission circuit section 33, a reception processing section 34, and a microcomputer 35 (a microcontroller). Examples of the control circuit 30 includes integrated circuits such as an SoC (System-on-Chip) and an ASSP (Application Specific Standard Product).

The switching circuit 31 is coupled to the first terminal 251 of the ultrasonic array chip 20, the transmission circuit section 33, and the reception processing section 34. The switching circuit 31 switches, based on control of the microcomputer 35, transmission coupling for coupling the first terminal 251 and the transmission circuit section 33 and reception coupling for coupling the first terminal 251 and the reception processing section 34.

The signal ground 32 is a ground coupled to the second terminal 252 and maintains the second terminal 252 at predetermined reference potential.

For example, the transmission circuit section 33 is controlled by the microcomputer 35 and outputs a pulse driving signal having a predetermined voltage to the first terminal 251. Consequently, the ultrasonic transducers 24 are driven and an ultrasonic wave is output from the ultrasonic array chip 20 toward the target object 1.

The reception processing section 34, for example, includes a reception amplifier and a comparator. The reception processing section 34 processes a reception signal output when an ultrasonic wave is received in the ultrasonic array chip 20 and outputs the reception signal to the microcomputer 35.

The microcomputer 35 includes a memory in which various programs and various data are stored, a processor that executes an instruction set described in a program stored in the memory, and the like. The microcomputer 35 instructs the transmission circuit section 33 to output the pulse driving signal to transmit an ultrasonic wave from the ultrasonic array chip 20. The microcomputer 35 measures a time from transmission timing of the ultrasonic wave until the reception signal is output from the reception processing section 34 and calculates, based on the time, a distance from the ultrasonic array chip 20 to the target object 1.

In this embodiment, the ultrasonic wave is transmitted to a narrow range of 10 mm or less of the target object 1 and a reflected ultrasonic wave of the ultrasonic wave is received. Therefore, it is possible to continuously calculate a distance between the target object 1 and the ultrasonic array chip 20 while moving a relative position of the ultrasonic array chip 20 to the target object 1. Therefore, it is possible to measure a surface state, for example, presence or absence of unevenness and an inclination angle of the target object 1.

Action Effects in this Embodiment

The ultrasonic sensor 10 in this embodiment transmits an ultrasonic wave to a target object and receives the ultrasonic wave reflected by the target object. The ultrasonic sensor 10 includes the ultrasonic array chip 20 on which the ultrasonic transducers 24 that transmit and receive ultrasonic waves are arranged in an array shape. Each of the ultrasonic transducers 24 includes the vibrating sections 221 and the piezoelectric elements 23 provided in the vibrating sections 221. The ultrasonic transducer 24 vibrates the vibrating sections 221 with voltage application to the piezoelectric elements 23 to transmit an ultrasonic wave and detects reception of the ultrasonic wave based on signals output from the piezoelectric elements by the vibration of the vibrating sections 221. In this embodiment, a resonance frequency of the ultrasonic transducer 24 is 2000 kHz or less.

In the ultrasonic sensor 10 having such a configuration, a reverberation time until reverberation vibration of the vibrating sections 221 at the time of the transmission of the ultrasonic wave is attenuated in the ultrasonic transducers 24 is sufficiently shorter than the reverberation time in the bulk-type ultrasonic vibrator. Therefore, even when the target object 1 is present in a position of 10 mm or less from the ultrasonic sensor 10, the reverberation vibration is suppressed when the ultrasonic wave reflected by the target object 1 is received by the ultrasonic transducers 24. The reception of the reflected ultrasonic wave can be properly detected. By setting the resonance frequency to 2000 kHz or less, ultrasonic wave attenuation in the air can be suppressed. Even the ultrasonic wave reflected by the target object 1 located at a short distance can be properly detected.

In the ultrasonic sensor 10 in this embodiment, the ultrasonic array chip 20 has the rectangular shape when viewed from the transmission direction of the ultrasonic wave and the array opening width is 5 mm or less.

In such a configuration, an ultrasonic beam is formed by the ultrasonic waves transmitted from the ultrasonic transducers 24 arranged in the ultrasonic sensor 10. However, a spot diameter of the ultrasonic beam is 10 mm or less in a distance range of 10 mm from the ultrasonic sensor 10. Therefore, the ultrasonic wave can be transmitted to a narrow range having a spot diameter of 10 mm or less of the target object 1. The distance between the narrow range of the target object 1 and the ultrasonic sensor 10 can be measured.

In this case, by continuously changing relative positions of the narrow range to which the ultrasonic wave is transmitted and the ultrasonic sensor 10 and monitoring a distance change, it is possible to measure an inclination of the target object 1 and a surface shape of the target object 1.

In the ultrasonic sensor 10 in this embodiment, the ultrasonic transducers 24 are configured to set the reverberation time to 60 µs or less when the resonance frequency of the ultrasonic transducers 24 is set to less than 1000 kHz.

Consequently, an ultrasonic beam having a spot diameter of 10 mm or less can be transmitted to the target object 1 at a short distance of approximately 10 mm from the ultrasonic sensor 10.

In the ultrasonic sensor 10 in this embodiment, the ultrasonic transducers 24 are configured to set the reverberation time to 50 µs or less when the resonance frequency of the ultrasonic transducers 24 is set to 1000 kHz or more and less than 1500 kHz.

Consequently, an ultrasonic beam having a spot diameter of 10 mm or less can be transmitted to the target object 1 at a distance of 5 mm to 10 mm from the ultrasonic sensor 10.

In the ultrasonic sensor 10 in this embodiment, the ultrasonic transducers 24 are configured to set the reverberation time to 25 µs or less when the resonance frequency of the ultrasonic transducers 24 is set to 1500 kHz or more and 2000 kHz or less.

Consequently, an ultrasonic beam having a spot diameter of 10 mm or less can be transmitted to the target object 1 at a distance of 5 mm or less from the ultrasonic sensor 10.

Modifications

The present disclosure is not limited to the embodiment explained above. Configurations obtained by, for example, combining modifications, improvement, and the embodiment in a range in which the object of the present disclosure can be achieved are included in the present disclosure.

Modification 1

In the embodiment, in FIG. 1, a space between the ultrasonic array chip 20 disposed on the substrate 11 and the target object 1 is a space in which the other components are disposed. However, the present disclosure is not limited to this.

Figure 10:
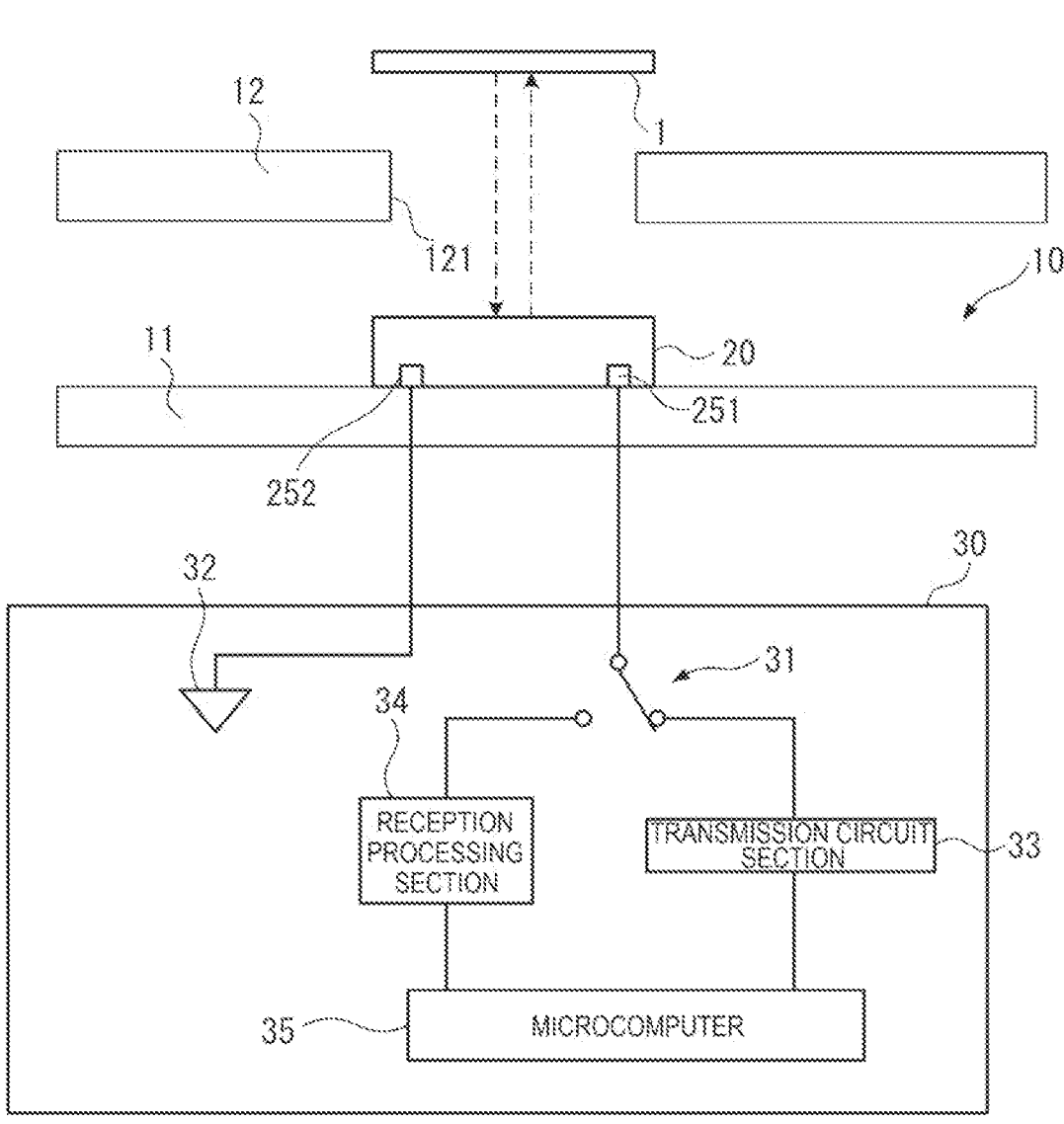
FIG. 10 is a schematic diagram showing a schematic configuration of an ultrasonic sensor according to a modification 1.

FIG. 10 is a schematic diagram showing another configuration example of the ultrasonic sensor 10. For example, as shown in FIG. 10, a partition plate 12 may be provided between the ultrasonic array chip 20 and the target object 1 to cover the ultrasonic array chip 20. A through-hole 121 through which an ultrasonic beam passes may be provided in the partition plate 12.

Modification 2

As explained above, in the present disclosure, the length of one side of the ultrasonic array chip 20 being 5 mm or less indicates that the length of one side of the rectangular transmission and reception region in the portion where the ultrasonic transducers 24 that transmit and receive ultrasonic waves are arranged in an array shape in the ultrasonic array chip 20. Therefore, for example, when a wiring region where a wire is formed is present on the outer side of the transmission and reception region, a size of the wiring region is not particularly limited.

In the embodiment, an example is explained in which the ultrasonic array chip 20 has the rectangular shape and the transmission and reception region of the ultrasonic wave transmission and reception surface 22A also has the rectangular shape. However, the present disclosure is not limited to this. For example, a square transmission and reception region, the length of one side of which is 5 mm or less, may be provided, a circular transmission and reception region, the diameter of which is 5 mm or less, may be provided, or an elliptical transmission and reception region, the major axis length of which is 5 mm or less, may be provided.

OVERVIEW OF THE PRESENT DISCLOSURE

An ultrasonic sensor according to a first aspect of the present disclosure is an ultrasonic sensor that transmits an ultrasonic wave to a target object and receives the ultrasonic wave reflected by the target object, the ultrasonic sensor including an ultrasonic array chip on which ultrasonic elements that transmit and receive the ultrasonic wave are arranged in an array shape. Each of the ultrasonic elements includes a vibrating section and a piezoelectric element provided in the vibrating section, vibrates the vibrating section with voltage application to the piezoelectric element to transmit the ultrasonic wave, and detects reception of the ultrasonic wave with a signal output from the piezoelectric element by the vibration of the vibrating section. A resonance frequency of the ultrasonic element is 2000 kHz or less.

Consequently, a reverberation time until reverberation vibration at the time of transmission of the ultrasonic wave in the ultrasonic element of the ultrasonic sensor is attenuated can be set sufficiently shorter compared with reverberation time in a bulk-type ultrasonic vibrator. Accordingly, even when the target object is present, for example, in a position of 10 mm or less from the ultrasonic sensor, the reverberation vibration can be suppressed when the ultrasonic wave reflected by the target object is received by the ultrasonic element. The reception of the reflected ultrasonic wave can be properly detected.

In the ultrasonic sensor according to this aspect, when viewed from a transmission direction of the ultrasonic wave, the ultrasonic array chip may have a rectangular shape, and length of one side of the ultrasonic array chip may be 5 mm or less.

Consequently, a spot diameter of an ultrasonic beam formed in a distance range of 10 mm from the ultrasonic sensor can be set to 10 mm or less. An inclination and a surface shape of the target object can be measured.

In the ultrasonic sensor according to this aspect, the resonance frequency of the ultrasonic element may be less than 1000 kHz, and the ultrasonic element may be configured to set a reverberation time to 60 μs or less, the reverberation time being a time until vibration amplitude of the vibrating section caused by transmitting the ultrasonic wave from the ultrasonic element decreases to 10% or less of the vibration amplitude of the vibrating section immediately after the transmission of the ultrasonic wave.

Consequently, an ultrasonic beam having a spot diameter of 10 mm or less can be transmitted to the target object at a short distance of approximately 10 mm from the ultrasonic sensor.

In the ultrasonic sensor according to this aspect, the resonance frequency of the ultrasonic element may be 1000 kHz or more and less than 1500 kHz, and the ultrasonic element may be configured to set a reverberation time to 50 μs or less, the reverberation time being a time until vibration amplitude of the vibrating section caused by transmitting the ultrasonic wave from the ultrasonic element decreases to 10% or less of the vibration amplitude of the vibrating section immediately after the transmission of the ultrasonic wave.

Consequently, an ultrasonic beam having a spot diameter of 10 mm or less can be transmitted to the target object at a distance of 5 mm to 10 mm from the ultrasonic sensor.

In the ultrasonic sensor according to this aspect, the resonance frequency of the ultrasonic element may be 1500 kHz or more and 2000 kHz or less, and the ultrasonic element may be configured to set a reverberation time to 25 μs or less, the reverberation time being a time until vibration amplitude of the vibrating section caused by transmitting the ultrasonic wave from the ultrasonic element decreases to 10% or less of the vibration amplitude of the vibrating section immediately after the transmission of the ultrasonic wave.

Consequently, an ultrasonic beam having a spot diameter of 10 mm or less can be transmitted to the target object at a distance of 5 mm or less from the ultrasonic sensor.

What is claimed is:

1. An ultrasonic sensor that transmits an ultrasonic wave to a target object and receives the ultrasonic wave reflected by the target object, the ultrasonic sensor comprising:

an ultrasonic array chip on which ultrasonic elements that transmit and receive the ultrasonic wave are arranged in an array shape, wherein each of the ultrasonic elements includes a vibrating section and a piezoelectric element provided in the vibrating section, vibrates the vibrating section to transmit the ultrasonic wave, and outputs a reception signal of the ultrasonic wave by the vibration of the vibrating section, and each of the ultrasonic elements is configured to selectably have one of the following properties:

a first property in which:
   a resonance frequency is 600 kHz or more and less than 1000 kHz;
   a reverberation time is 60 us or less;
   a distance between the ultrasonic sensor and the target object is 10 mm; and
   a spot diameter of an ultrasonic beam is 10 mm or less;

a second property in which:
   the resonance frequency is 1000 kHz or more and less than 1500 KHz;
   the reverberation time is 50 us or less;
   the distance between the ultrasonic sensor and the target object is in a range of 5 mm to 10 mm; and
   the spot diameter of the ultrasonic beam is 10 mm or less; and a third property in which:
   the resonance frequency is in a range of 1500 kHz to 2000 kHz;
   the reverberation time is 25 us or less;
   the distance between the ultrasonic sensor and the target object is 5 mm or less; and the spot diameter of the ultrasonic beam is 10 mm or less.

2. The ultrasonic sensor according to claim 1, wherein, when viewed from a transmission direction of the ultrasonic wave, the ultrasonic array chip has a rectangular shape, and a length of one side of the ultrasonic array chip is 5 mm or less.

3. The ultrasonic sensor according to claim 1, wherein the reverberation time is a time until a vibration amplitude of the vibrating section caused by transmitting the ultrasonic wave from the ultrasonic element decreases to 10% or less of the vibration amplitude of the vibrating section immediately after the transmission of the ultrasonic wave.

4. The ultrasonic sensor according to claim 2, wherein the reverberation time is a time until a vibration amplitude of the vibrating section caused by transmitting the ultrasonic wave from the ultrasonic element decreases to 10% or less of the vibration amplitude of the vibrating section immediately after the transmission of the ultrasonic wave.

* * * * *